United States Patent
Masuda et al.

(10) Patent No.: US 10,418,161 B2
(45) Date of Patent: Sep. 17, 2019

(54) SOFT MAGNETIC PARTICLE POWDER, SOFT MAGNETIC RESIN COMPOSITION, SOFT MAGNETIC FILM, SOFT MAGNETIC FILM LAMINATED CIRCUIT BOARD, AND POSITION DETECTION DEVICE

(71) Applicant: NITTO DENKO CORPORATION, Osaka (JP)

(72) Inventors: Shotaro Masuda, Osaka (JP); Hirofumi Ebe, Osaka (JP); Takashi Habu, Osaka (JP); Akihito Matsutomi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 319 days.

(21) Appl. No.: 15/025,473

(22) PCT Filed: Sep. 18, 2014

(86) PCT No.: PCT/JP2014/074638
§ 371 (c)(1),
(2) Date: Mar. 28, 2016

(87) PCT Pub. No.: WO2015/049993
PCT Pub. Date: Apr. 9, 2015

(65) Prior Publication Data
US 2016/0211061 A1    Jul. 21, 2016

(30) Foreign Application Priority Data

Oct. 1, 2013 (JP) .................. 2013-206710
Aug. 29, 2014 (JP) .................. 2014-175877

(51) Int. Cl.
*H01F 5/00* (2006.01)
*H01F 1/28* (2006.01)
(Continued)

(52) U.S. Cl.
CPC .............. *H01F 1/28* (2013.01); *B22F 1/0011* (2013.01); *B22F 1/0055* (2013.01); *H01F 3/08* (2013.01);
(Continued)

(58) Field of Classification Search
CPC ....................................................... H01F 5/00
(Continued)

(56) References Cited

U.S. PATENT DOCUMENTS

| 5,651,841 A | 7/1997 | Moro et al. |
| 2003/0000340 A1* | 1/2003 | Mende ..................... B22F 9/22 |
| | | 75/351 |

(Continued)

FOREIGN PATENT DOCUMENTS

| CN | 1122527 A | 5/1996 |
| CN | 101536125 A | 9/2009 |

(Continued)

OTHER PUBLICATIONS

International Preliminary Report on Patentability issued by WIPO dated Apr. 14, 2016, in connection with International Patent Application No. PCT/JP2014/074638.

(Continued)

*Primary Examiner* — Tuyen T Nguyen
(74) *Attorney, Agent, or Firm* — Edwards Neils LLC; Jean C. Edwards, Esq.

(57) ABSTRACT

Soft magnetic particle powder is soft magnetic particle powder composed of flat soft magnetic particles, and the soft magnetic particle powder has a particle size $D_{10}$ and a particle size $D_{50}$ measured with a laser diffraction particle size distribution analyzer satisfying formula below: $D_{10}/D_{50} > 0.30$.

6 Claims, 1 Drawing Sheet

(51) Int. Cl.
*H05K 3/28* (2006.01)
*B22F 1/00* (2006.01)
*H01F 3/08* (2006.01)
H05K 1/03 (2006.01)
C22C 33/02 (2006.01)
B22F 7/04 (2006.01)

(52) U.S. Cl.
CPC ............... *H01F 5/00* (2013.01); *H05K 3/285* (2013.01); *B22F 2007/042* (2013.01); *C22C 33/0257* (2013.01); *C22C 2202/02* (2013.01); *H05K 1/0373* (2013.01); *H05K 2201/0245* (2013.01); *H05K 2201/086* (2013.01)

(58) Field of Classification Search
USPC ...................... 336/65, 83, 200, 212, 232–234
See application file for complete search history.

(56) References Cited

U.S. PATENT DOCUMENTS

| | | | |
|---|---|---|---|
| 2006/0099454 | A1 | 5/2006 | Morikoshi et al. |
| 2009/0110587 | A1* | 4/2009 | Aramaki ............... B22F 1/0055 419/10 |
| 2009/0267017 | A1 | 10/2009 | Matsukawa et al. |
| 2012/0188046 | A1 | 7/2012 | Matsuura et al. |
| 2013/0176098 | A1* | 7/2013 | Matsuura ............... H01F 27/255 336/221 |
| 2014/0104031 | A1* | 4/2014 | Ogawa ...................... B22F 1/02 336/221 |
| 2014/0225703 | A1* | 8/2014 | Otake ....................... H01F 1/24 336/221 |

FOREIGN PATENT DOCUMENTS

| | | | |
|---|---|---|---|
| CN | 102610362 | A | 7/2012 |
| JP | 06-041602 | A | 2/1994 |
| JP | H06-149450 | A | 5/1994 |
| JP | 08-236331 | A | 9/1996 |
| JP | 11-260616 | A | 9/1999 |
| JP | 2005-194565 | A | 7/2005 |
| JP | 2005-294683 | | 10/2005 |
| JP | 2006-039947 | A | 2/2006 |
| JP | 2006-135136 | A | 5/2006 |
| JP | 2007-088316 | A | 4/2007 |
| JP | 2008-115404 | A | 5/2008 |
| JP | 2008-189788 | A | 8/2008 |
| JP | 2008214661 | A * | 9/2008 |
| JP | 2009-059753 | A | 3/2009 |
| JP | 2009-266960 | A | 11/2009 |
| JP | 2009-267237 | A | 11/2009 |
| JP | 2011-082278 | A | 4/2011 |
| JP | 2012-212790 | A | 11/2012 |

OTHER PUBLICATIONS

International Search Report Issued in PCT/JP2014/074638 dated Dec. 12, 2014.
Written Opinion Issued in PCT/JP2014/074638 dated Dec. 12, 2014.
Yuichi Sato et al.; Classification Mechanism of an Air Classifier Using Centrifugal Force (Pat 3)—Effects of Air Flow Rate and Blade Attitude Angle on Cut Size-; Journal of the Society of Powder Technology; 1990; pp. 225-230; vol. 27, No. 4; Japan.
Extended European Search Report issued by the European Patent Office dated Apr. 19, 2017, in connection with European Patent Application No. 14850185.1.
Notification of First Office Action issued by the State Intellectual Property Office of China dated Jun. 28, 2017, in connection with Chinese Patent Application No. 201480054812.2.
Office Action issued by the Japanese Patent Office dated Nov. 13, 2018, in connection with Japanese Patent Application No. 2014-175877.
Office Action issued by the State Intellectual Property Office dated Aug. 8, 2018 in connection with Chinese Patent Application No. 201480054812.2.
Office Action issued by the European Patent Office dated Aug. 30, 2018 in connection with European Patent Application No. 14850185.1.
Office Action, issued by the State Intellectual Property Office dated Feb. 2, 2018, in connection with Chinese Patent Application No. 201480054812.2.
Office Action, issued by the Taiwanese Intellectual Property Office dated Feb. 7, 2018, in connection with Taiwanese Patent Application No. 103134278.
Notification of Reasons for Refusal issued by the Japanese Patent Office dated Apr. 3, 2018 in connection with Japanese Patent Application No. 2014-175877.
Office Action issued by the State Intellectual Property Office of China dated Apr. 2, 2019, in connection with Chinese Patent Application No. 201480054812.2.

* cited by examiner

SOFT MAGNETIC PARTICLE POWDER, SOFT MAGNETIC RESIN COMPOSITION, SOFT MAGNETIC FILM, SOFT MAGNETIC FILM LAMINATED CIRCUIT BOARD, AND POSITION DETECTION DEVICE

CROSS-REFERENCE TO RELATED APPLICATIONS

The present application is a 35 U.S.C. 371 National Stage Entry of PCT/JP2014/074638, filed on Sep. 18, 2014, which claims priority from Japanese Patent Application Nos. 2013-206710, filed on Oct. 1, 2013, and 2014-175877, filed on Aug. 29, 2014, the contents of all of which are herein incorporated by reference in their entirety.

TECHNICAL FIELD

The present invention relates to soft magnetic particle powder, a soft magnetic resin composition produced by using the soft magnetic particle powder, a soft magnetic film, a soft magnetic film laminated circuit board, and a position detection device.

BACKGROUND ART

Recently, electronic devices such as personal computers and smartphones are equipped with functions of wireless communications and wireless power transmission. In electronic devices, for broadening distance of wireless communication, better efficiency, and a smaller size, a magnetic film for convergence of magnetic flux is disposed around an antenna or coil included in the electronic device (for example, see Patent Document 1).

Patent Document 1 discloses a flexible magnetic film formed by blending flat soft magnetic powder with a binder.

Meanwhile, for improvement in convergence efficiency of magnetic flux, it is important to improve relative magnetic permeability (magnetic properties) of the magnetic film. Generally, increasing the thickness of the magnetic film improves relative magnetic permeability. However, because a small-sized electronic device and furthermore, a thin magnetic film are demanded, it is difficult to meet the demand of a smaller thickness with the above-described method.

Also, increasing the particle size of the magnetic film containing soft magnetic particles can improve relative magnetic permeability (for example, see Patent Document 2).

Patent Document 2 discloses use of a flat soft magnetic material specifying a particle size, a coercive force, and a bulk density for a magnetic sheet.

CITATION LIST

Patent Document

Patent Document 1: Japanese Unexamined Patent Publication No. 2006-39947
Patent Document 2: Japanese Unexamined Patent Publication No. 2009-266960

SUMMARY OF THE INVENTION

Problem to be Solved by the Invention

Further improvement of relative magnetic permeability is required for the soft magnetic film.

When the particle size of the soft magnetic particles is too large, the soft magnetic particles easily aggregate and precipitate in a liquid composition containing the soft magnetic particles, so that there is a disadvantage that application and forming (film-forming) thereof into a film is difficult.

It is an object of the present invention to provide soft magnetic particle powder that is easily capable of producing a soft magnetic film having excellent relative magnetic permeability, a soft magnetic resin composition produced from the soft magnetic particle powder, a soft magnetic film, a soft magnetic film laminated circuit board, and a position detection device.

Means for Solving the Problem

Soft magnetic particle powder of the present invention is soft magnetic particle powder composed of flat soft magnetic particles, and the soft magnetic particle powder has a particle size $D_{10}$ and a particle size $D_{50}$ measured with a laser diffraction particle size distribution analyzer satisfying formula below: $D_{10}/D_{50} > 0.30$.

A soft magnetic resin composition of the present invention contains the soft magnetic particle powder and a resin component.

It is preferable that in the soft magnetic resin composition of the present invention, the resin component contains epoxy resin, phenol resin, and acrylic resin.

A soft magnetic film of the present invention is formed from the above-described soft magnetic resin composition.

A soft magnetic film laminated circuit board of the present invention is produced by laminating the soft magnetic film on a circuit board.

A position detection device of the present invention includes the soft magnetic film laminated circuit board.

Effect of the Invention

The soft magnetic particle powder of the present invention is soft magnetic particle powder composed of flat soft magnetic particles, and the soft magnetic particle powder has a particle size $D_{10}$ and a particle size $D_{50}$ measured with a laser diffraction particle size distribution analyzer satisfying formula below: $D_{10}/D_{50} > 0.30$. Thus, when the soft magnetic resin composition of the present invention containing the soft magnetic particle powder, the soft magnetic film having excellent relative magnetic permeability can be easily produced.

The soft magnetic film laminated circuit board and the position detection device of the present invention including the soft magnetic film can achieve high efficiency or the like.

BRIEF DESCRIPTION OF THE DRAWINGS

FIG. 1A illustrating a step of disposing a soft magnetic film and a circuit board, FIG. 1B illustrating a step of laminating an adhesive layer on the circuit board, and FIG. 1C illustrating a step of laminating the soft magnetic film on the adhesive layer.

DESCRIPTION OF EMBODIMENTS

1. Soft Magnetic Particle Powder

Figure 1A:
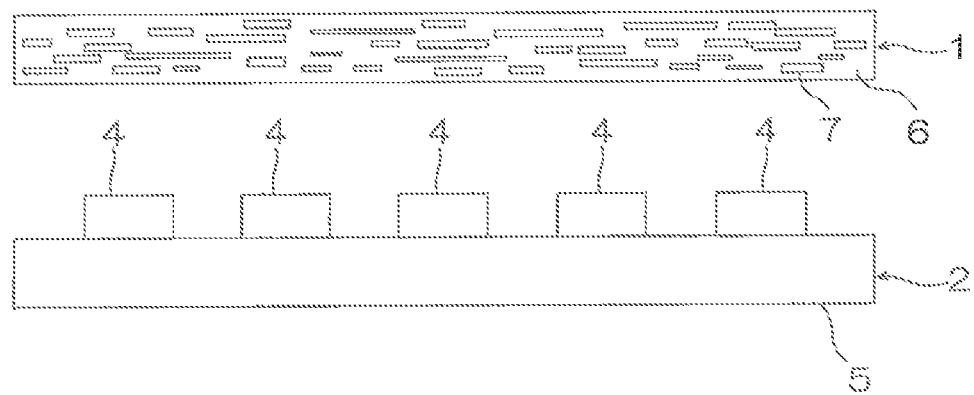
FIGS. 1A to 1C show production process diagrams of an embodiment of a soft magnetic film laminated circuit board of the present invention.

Soft magnetic particle powder of the present invention is made of flat soft magnetic particles.

The soft magnetic particles are particles having a coercive force of, for example, 10 A/m or more (preferably 50 A/m or more) and 1000 A/m or less (preferably 200 A/m or less), and examples of its soft magnetic material include magnetic stainless steel (Fe—Cr—Al—Si alloy), Sendust (Fe—Si—Al alloy), Permalloy (Fe—Ni alloy), silicon copper (Fe—Cu—Si alloy), Fe—Si alloy, Fe—Si—B (—Cu—Nb) alloy, Fe—Si—Cr—Ni alloy, Fe—Si—Cr alloy, Fe—Si—Al—Ni—Cr alloy, and ferrite.

Among these, preferably, Sendust (Fe—Si—Al alloy) is used. More preferably, a Fe—Si—Al alloy having a Si content of 9 to 15 mass % is used. Use of these allows the soft magnetic film to have excellent magnetic permeability.

The soft magnetic particles are formed into flat (platy), that is, formed to have a small thickness and a wide plane. The soft magnetic particle powder has an aspect ratio of, for example, 8 or more, preferably 15 or more, and for example, 80 or less, preferably 65 or less. The aspect ratio is calculated, for example, as an aspect ratio by dividing the particle size $D_{50}$ (described later) of the soft magnetic particles with the average thickness of the soft magnetic particles.

The soft magnetic particle powder has a particle size $D_{10}$ of, for example, 10 μm or more, preferably 20 μm or more, more preferably 30 μm or more, even more preferably 40 μm or more, and for example, 100 μm or less, preferably 80 μm or less, more preferably 60 μm or less.

The soft magnetic particle powder has a particle size $D_{50}$ of, for example, 30 μm or more, preferably 40 μm or more, more preferably 70 μm or more, even more preferably 80 μm or more, and for example, 200 μm or less, preferably 150 μm or less, more preferably 130 μm or less.

The ratio of the particle size $D_{10}$ to the particle size $D_{50}$, i.e., $D_{10}/D_{50}$ satisfies formula (1) below, preferably formula (2) below, more preferably formula (3) below, even more preferably formula (4) below.

$$D_{10}/D_{50} > 0.30 \quad (1)$$

$$D_{10}/D_{50} > 0.45 \quad (2)$$

$$D_{10}/D_{50} > 0.48 \quad (3)$$

$$D_{10}/D_{50} > 0.50 \quad (4)$$

The ratio $D_{10}/D_{50}$ satisfying the above-described formulas allows for a thin soft magnetic film, and relative magnetic permeability of the soft magnetic film excellently.

The ratio $D_{10}/D_{50}$ satisfies preferably formula (5) below, more preferably formula (6) below.

$$0.90 > D_{10}/D_{50} \quad (5)$$

$$0.70 > D_{10}/D_{50} \quad (6)$$

The soft magnetic particle powder has a particle size $D_{90}$ of, for example, 80 μm or more, preferably 100 μm or more, more preferably 130 μm or more, and for example, 350 μm or less, preferably 200 μm or less, more preferably 150 μm or less. The particle size $D_{90}$ of the soft magnetic particle powder within the above-described range allows for improvement in film-forming characteristics of the soft magnetic film, and relative magnetic permeability of the soft magnetic film excellently.

$D_{10}$, $D_{50}$ and $D_{90}$ are volume-based particle ratio, and $D_{10}$ represents a particle size of a cumulative distribution of 10%, $D_{50}$ represents a particle size of a cumulative distribution of 50%, and $D_{90}$ represents a particle size of a cumulative distribution of 90%.

$D_{10}$, $D_{50}$, and $D_{90}$ are measured, for example, with a laser diffraction particle size distribution analyzer (manufactured by Sympatec, HELOS & RODOS).

The soft magnetic particle powder can be produced by classifying known or commercially available soft magnetic particle powder with, for example, a classifier such as a dry classifier, so that its distribution includes only a specific particle size. To be specific, it can be produced by blowing air to the soft magnetic particle powder using a rotational vane of a dry classifier to blow away lightweight soft magnetic particles, and collect heavyweight soft magnetic particles.

The rotational vane has a rotational speed of, for example, 500 rpm or more, preferably 800 rpm or more, more preferably 1000 rpm or more, and for example, 3000 rpm or less, preferably 2500 rpm or less, more preferably 2200 rpm or less, even more preferably 1500 rpm or less.

The air flow rate is, for example, 0.5 m³/min or more, preferably 1.0 m³/min or more, and for example, 2.0 m³/min or less, preferably 1.5 m³/min or less, more preferably 1.3 m³/min or less.

2. Soft Magnetic Resin Composition

A soft magnetic resin composition of the present invention contains the soft magnetic particle powder and a resin component.

The resin component can contain any of a thermosetting resin and a thermoplastic resin, but preferably contains a thermosetting resin.

Examples of the thermosetting resin include epoxy resin, phenol resin, amino resin, unsaturated polyester resin, polyurethane resin, silicone resin, urea resin, melamine resin, thermosetting polyimide resin, and diallyl phthalate resin. Preferably, epoxy resin and phenol resin are used, and more preferably, epoxy resin and phenol resin are used in combination.

For the epoxy resin, for example, those which can be used as an adhesive composition can be used, including bisphenol epoxy resin (particularly, bisphenol A epoxy resin, bisphenol F epoxy resin, bisphenol S epoxy resin, brominated bisphenol A epoxy resin, hydrogenated bisphenol A epoxy resin, bisphenol AF epoxy resin, etc.), phenol epoxy resin (particularly, phenol novolak epoxy resin, ortho-cresol novolak epoxy resin, etc.), biphenyl epoxy resin, naphthalene epoxy resin, fluorene epoxy resin, trishydroxyphenylmethane epoxy resin, and tetraphenylolethane epoxy resin. Furthermore, for example, hydantoin epoxy resin, trisglycidylisocyanurate epoxy resin, and glycidylamine epoxy resin can be also used. These can be used singly, or can be used in combination of two or more.

Of these examples of the epoxy resin, preferably, bisphenol epoxy resin, or more preferably, bisphenol A epoxy resin is used. Containing the epoxy resin allows for excellent reactivity with the phenol resin, and as a result, the soft magnetic film has excellent heat resistance and relative magnetic permeability.

The phenol resin is an epoxy resin curing agent, and for example, novolak phenol resins such as phenolnovolak resin, phenolaralkyl resin, cresol novolak resin, tert-butylphenolnovolak resin, and nonylphenolnovolak resin; resole phenol resin; and polyoxystyrenes such as polyparaoxystyrene are used. These can be used singly, or can be used in combination of two or more.

Of these phenol resins, preferably, novolak resin, more preferably, phenolnovolak resin, phenolaralkyl resin, or even more preferably, phenolaralkyl resin is used. Containing these phenol resins allows for improvement in connection reliability of a soft magnetic film laminated circuit board produced by laminating the soft magnetic film on a circuit board.

When the hydroxyl equivalent of the phenol resin relative to 100 g/eq of the epoxy equivalent of the epoxy resin is 1 g/eq or more and less than 100 g/eq, the epoxy resin content relative to 100 parts by mass of the resin component is, for example, 15 parts by mass or more, preferably 30 parts by mass or more, and for example, 70 parts by mass or less, and the phenol resin content relative to 100 parts by mass of the resin component is, for example, 5 parts by mass or more, preferably 15 parts by mass or more, and for example, 30 parts by mass or less.

When the hydroxyl equivalent of the phenol resin relative to 100 g/eq of the epoxy equivalent of the epoxy resin is 100 g/eq or more and less than 200 g/eq, the epoxy resin content relative to 100 parts by mass of the resin component is, for example, 10 parts by mass or more, preferably 25 parts by mass or more, and for example, 50 parts by mass or less, and the phenol resin content relative to 100 parts by mass of the resin component is, for example, 10 parts by mass or more, preferably 25 parts by mass or more, and for example, 50 parts by mass or less.

When the hydroxyl equivalent of the phenol resin relative to 100 g/eq of the epoxy equivalent of the epoxy resin is 200 g/eq or more and 1000 g/eq or less, the epoxy resin content relative to 100 parts by mass of the resin component is, for example, 5 parts by mass or more, preferably 15 parts by mass or more, and for example, 30 parts by mass or less, and the phenol resin content relative to 100 parts by mass of the resin component is, for example, 15 parts by mass or more, preferably 35 parts by mass or more, and for example, 70 parts by mass or less.

When two types of epoxy resins are used in combination, the epoxy equivalent is an epoxy equivalent of the total epoxy resins calculated by multiplying the epoxy equivalent of each of the epoxy resins by the mass ratio of each of the epoxy resins relative to the total amount of the epoxy resins, and adding these.

The hydroxyl equivalent of the phenol resin per 1 equivalent of the epoxy group of the epoxy resin is, for example, 0.2 equivalent or more, preferably 0.5 equivalent or more, and for example, 2.0 equivalent or less, preferably 1.2 equivalent or less. When the amount of the hydroxyl group is within the above-described range, curing reaction of the soft magnetic film in semi-cured state will be excellent, and deterioration can be suppressed.

The resin component has a thermosetting resin content relative to 100 parts by mass of the resin component of, for example, 20 parts by mass or more, preferably 30 parts by mass or more, and for example, 90 parts by mass or less, preferably 80 parts by mass or less, more preferably 60 parts by mass or less.

The resin component contains, in addition to the thermosetting resin, preferably acrylic resin. More preferably, acrylic resin, epoxy resin, and phenol resin are used in combination. The resin component containing these resins allows for production of a uniform soft magnetic film without unevenness on lamination interface and having excellent relative magnetic permeability when a plurality of soft magnetic films in semi-cured state are laminated and heat-pressed to produce a sheet of soft magnetic film in cured state.

An example of the acrylic resin includes an acrylic polymer produced by polymerizing a monomer component of one, or two or more alkyl (meth)acrylates having a straight chain or branched alkyl group. The "(meth)acryl" represents "acryl and/or methacryl".

An example of the alkyl group includes an alkyl group having 1 to 20 carbon atoms such as methyl group, ethyl group, propyl group, isopropyl group, n-butyl group, t-butyl group, isobutyl group, amyl group, isoamyl group, hexyl group, heptyl group, cyclohexyl group, 2-ethylhexyl group, octyl group, isooctyl group, nonyl group, isononyl group, decyl group, isodecyl group, undecyl group, lauryl group, tridecyl group, tetradecyl group, stearyl group, octadecyl group, and dodecyl group. Preferably, an alkyl group having 1 to 6 carbon atoms is used.

The acrylic polymer can be a copolymer of alkyl (meth)acrylate and an additional monomer.

Examples of the additional monomer include glycidyl group-containing monomers such as glycidyl acrylate and glycidyl methacrylate; carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic acid anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-(hydroxymethyl)cyclohexyl)methyl acrylate; sulfonic acid group-containing monomers such as styrenesulfonic acid, allylsulfonic acid, 2-(meth) acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group-containing monomers such as 2-hydroxyethylacryloyl phosphate; styrene monomer; and acrylonitrile.

Among these, preferably, a glycidyl group-containing monomer, a carboxyl group-containing monomer, or a hydroxyl group-containing monomer is used. When the acrylic resin is a copolymer of alkyl (meth)acrylate and an additional monomer of these, that is, when the acrylic resin contains a glycidyl group, a carboxyl group, or a hydroxyl group, the heat resistance of the soft magnetic film is excellent.

When the acrylic resin is a copolymer of alkyl (meth)acrylate and an additional monomer, the mixing ratio (mass) of the additional monomer relative to the copolymer is preferably 40 mass % or less.

The acrylic resin has a weight-average molecular weight of, for example, $1\times10^5$ or more, preferably $3\times10^5$ or more, and for example, $1\times10^6$ or less. The weight-average molecular weight of the acrylic resin within this range allows for excellent adhesiveness and heat resistance of the soft magnetic film. The weight-average molecular weight is measured based on polystyrene standard calibration value by Gel Permeation Chromatography (GPC).

The acrylic resin has a glass transition temperature (Tg) of, for example, −30° C. or more, preferably −20° C. or more, and for example, 30° C. or less, preferably 15° C. or less. The acrylic resin with a glass transition temperature (Tg) of the above-described lower limit or more allows for excellent adhesiveness of the soft magnetic film in semi-cured state. Meanwhile, the acrylic resin with a glass transition temperature (Tg) of the above-described upper limit or less allows for excellent handleability of the soft magnetic film. The glass transition temperature is obtained by the maximum value of loss tangent (tan δ) measured by using a dynamic viscoelasticity measuring apparatus (DMA, frequency 1 Hz, rising temperature speed 10° C./min).

When the resin component contains acrylic resin, the acrylic resin content relative to 100 parts by mass of the resin component is, for example, 10 parts by mass or more, preferably 20 parts by mass or more, more preferably 40 parts by mass or more, and for example, 80 parts by mass or less, preferably 70 parts by mass or less. The acrylic resin content within this range allows for excellent film-forming characteristics of the soft magnetic resin composition and adhesiveness of the soft magnetic film in semi-cured state.

The soft magnetic resin composition has a soft magnetic particle powder content of, for example, 50 mass % or more, preferably 60 mass % or more, more preferably 80 mass % or more, and for example, 98 mass % or less, preferably 95 mass % or less. The soft magnetic particle powder content within the above-described range allows for excellent relative magnetic permeability of the soft magnetic film.

The soft magnetic resin composition has a resin component content of, for example, 2 mass % or more, preferably 5 mass % or more, and for example, 50 mass % or less, preferably 20 mass % or less, more preferably 15 mass % or less. The resin component content within the above-described range allows for excellent film-forming characteristics of the soft magnetic resin composition.

The resin component can contain a resin other than the thermosetting resin and the acrylic resin. An example of the resin other than the thermosetting resin and the acrylic resin includes a thermoplastic resin. These examples of the resin other than the thermosetting resin and the acrylic resin can be used singly, or can be used in combination of two or more.

Examples of the thermoplastic resin include natural rubber, butyl rubber, isoprene rubber, chloroprene rubber, ethylene-vinyl acetate copolymer, polybutadiene resin, polycarbonate resin, thermoplastic polyimide resin, polyamide resin (6-nylon, 6,6-nylon, etc.), phenoxy resin, saturated polyester resin (PET, PBT, etc.), polyamide-imide resin, and fluorine resin.

The soft magnetic resin composition (and soft magnetic film) preferably contains a thermosetting catalyst.

The thermosetting catalyst is not limited as long as the catalyst accelerates curing of the thermosetting resin by heating, and for example, an imidazole compound, a triphenylphosphine compound, a triphenylborane compound, and an amino group-containing compound can be used. Preferably, an imidazole compound is used.

Examples of the imidazole compound include 2-phenylimidazole (trade name; 2PZ), 2-ethyl-4-methylimidazole (trade name; 2E4MZ), 2-methylimidazole (trade name; 2MZ), 2-undecylimidazole (trade name; C11Z), 2-phenyl-4,5-dihydroxymethylimidazole (trade name; 2-PHZ), 2-phenyl-1H-imidazole 4,5-dimethanol (trade name; 2PHZ-PW), and 2,4-diamino-6-(2'-methylimidazolyl (1)') ethyl-s-triazine-isocyanuric acid adduct (trade name; 2MAOK-PW) (the products with the trade names shown above are all manufactured by Shikoku Chemicals Corporation).

The shape of the thermosetting catalyst includes spherical and ellipsoidal shapes.

These thermosetting catalysts can be used singly, or can be used in combination of two or more.

The mixing ratio of the thermosetting catalyst relative to 100 parts by mass of the resin component is, for example, 0.2 parts by mass or more, preferably 0.3 parts by mass or more, and for example, 5 parts by mass or less, preferably 2 parts by mass or less. When the mixing ratio of the thermosetting catalyst is the above-described upper limit or less, the soft magnetic resin composition can achieve excellent storage stability for a long period of time under room temperature. Meanwhile, when the mixing ratio of the thermosetting catalyst is the lower limit or more, the soft magnetic film in semi-cured state can be heated and cured at a low temperature for a short period of time, and a soft magnetic film in cured state can be produced efficiently.

The soft magnetic resin composition can further contain, as necessary, an additional additive. Examples of the additive include a commercially available or known cross-linking agent and inorganic filler.

The soft magnetic resin composition can be prepared by mixing the above-described components at the above-described mixing ratio.

3. Soft Magnetic Film

The soft magnetic film of the present invention is formed from the soft magnetic resin composition into a sheet.

The soft magnetic film can be produced from, for example, a preparation step in which a solution of a soft magnetic resin composition is prepared by dissolving or dispersing a soft magnetic resin composition in a solvent, a drying step in which the solution of the soft magnetic resin composition is applied on the surface of a release substrate and dried to produce a soft magnetic film in semi-cured state, and a heat-pressing step in which a plurality of soft magnetic films in semi-cured state are laminated and heat-pressed.

First, the soft magnetic resin composition is dissolved or dispersed in a solvent (preparation step). A solution of the soft magnetic resin composition is prepared in this manner.

Examples of the solvent include organic solvents including ketones such as acetone and methyl ethyl ketone (MEK); esters such as ethyl acetate; amides such as N,N-dimethylformamide; and ethers such as propylene glycol monomethyl ether. Examples of the solvent also include water, and water-based solvents such as alcohols including methanol, ethanol, propanol, and isopropanol.

The solution of the soft magnetic resin composition has a solid content amount of, for example, 5 mass % or more, preferably 10 mass % or more, and for example, 50 mass % or less, preferably 20 mass % or less.

The solution of the soft magnetic resin composition is prepared in this manner.

Then, the solution of the soft magnetic resin composition is applied on the surface of the release substrate and dried (drying step).

Examples of the release substrate include a separator and a core material.

Examples of the separator include a polyethylene terephthalate (PET) film, a polyethylene film, a polypropylene film, and paper. Surfaces of these are treated with, for example, a fluorine release agent, a long-chain alkylacrylate release agent, and a silicone release agent.

Examples of the core material include a plastic film (for example, polyimide film, polyester film, polyethylene terephthalate film, polyethylenenaphthalate film, polycarbonate film, etc.), a metal film (for example, aluminum foil etc.), a resin substrate reinforced with glass fiber or plastic-made nonwoven fiber, a silicon substrate, and a glass substrate.

The separator or the core material has an average thickness of, for example, 1 μm or more and 500 μm or less.

The application method is not particularly limited, and examples thereof include a doctor blade method, roll application, screen application, and gravure application.

The drying conditions are as follows: a drying temperature of, for example, 70° C. or more and 160° C. or less, and a drying time of, for example, 1 minute or more and 5 minutes or less.

A soft magnetic film in semi-cured state is produced in this manner.

The soft magnetic film is in semi-cured state (B-stage state) at room temperature (to be specific, 25° C.), and is a soft magnetic adhesive film having excellent adhesiveness.

The soft magnetic film (semi-cured state) has an average film thickness of, for example, 500 μm or less, preferably 300 μm or less, more preferably 200 μm or less, even more preferably, 150 μm or less, most preferably 100 μm or less, and for example, 5 μm or more, preferably 50 μm or more.

Then, a plurality of produced soft magnetic films in semi-cured state are prepared, and the plurality of soft magnetic films are heat-pressed with a heat press in a thickness direction (heat-pressing step).

The heat-pressing can be performed by using a known press, and for example, a parallel plate press is used.

For example, two layers or more, and 20 layers or less, preferably 5 layers or less of the soft magnetic films (semi-cured state) are laminated. The soft magnetic film can be adjusted to have a desired film thickness in this manner.

The heating temperature is, for example, 80° C. or more, preferably 100° C. or more, and for example, 200° C. or less, preferably 175° C. or less.

The heating time is, for example, 0.1 hours or more, preferably 0.2 hours or more, and for example, 24 hours or less, preferably 3 hours or less, more preferably 2 hours or less.

The pressure is, for example, 10 MPa or more, preferably 20 MPa or more, and for example, 500 MPa or less, preferably 200 MPa or less. In this manner, relative magnetic permeability of the soft magnetic particles in the soft magnetic film, and the thin soft magnetic film can be achieved more excellently.

In this manner, a soft magnetic film in cured state (C-stage state) can be produced.

The soft magnetic film has a film thickness of, for example, 5 μm or more, preferably 50 μm or more, and for example, 500 μm or less, preferably 250 μm or less.

The filling rate of the soft magnetic particles (volume percentage, excluding gaps, of the soft magnetic particles accounting for the solid content in the soft magnetic film) relative to the solid content of the soft magnetic film is, for example, 50% by volume or more, preferably 55% by volume or more, and for example, 95% by volume or less, preferably 90% by volume or less. This allows for excellent relative magnetic permeability of the soft magnetic film. The volume percentage of the soft magnetic particles can be, for example, measured by the Archimedes method.

In the soft magnetic film, the soft magnetic particles contained in the soft magnetic film are preferably arranged in a 2-dementional in-plane direction of the soft magnetic film. That is, a longitudinal direction (direction perpendicular to thickness direction) of the flat soft magnetic particles is oriented to be along a surface direction of the soft magnetic film (ref: FIG. 1A). Thus, the soft magnetic film has further more excellent relative magnetic permeability.

The soft magnetic film has a relative magnetic permeability of, for example, 190 or more, preferably 220 or more, more preferably 250 or more, even more preferably 280 or more.

The soft magnetic film can be, for example, a single layer structure composed only of a single layer of the soft magnetic film, a multiple layer structure in which the soft magnetic film is laminated on one side or both sides of the core material, or a multiple layer structure in which a separator is laminated on one side or both sides of the soft magnetic film.

Although the plurality of soft magnetic films in semi-cured state are laminated and heat-pressed in the above-described embodiment, for example, the heat-pressing can be performed on a single soft magnetic film in semi-cured state (single layer).

Furthermore, although the soft magnetic film in semi-cured state is heat-pressed in the above-described embodiment, the heat-pressing does not have to be performed. That is, the soft magnetic film can be used as it is in semi-cured state. The surface of the soft magnetic film in semi-cured state is adhesive, and therefore, can be directly laminated on a circuit board (described later), for example, without using an adhesive. Thereafter, as necessary, curing can be performed to produce a soft magnetic film in cured state.

4. Soft Magnetic Film Laminated Circuit Board

A soft magnetic film laminated circuit board of the present invention is produced by laminating the soft magnetic film on a circuit board.

Figure 1B:
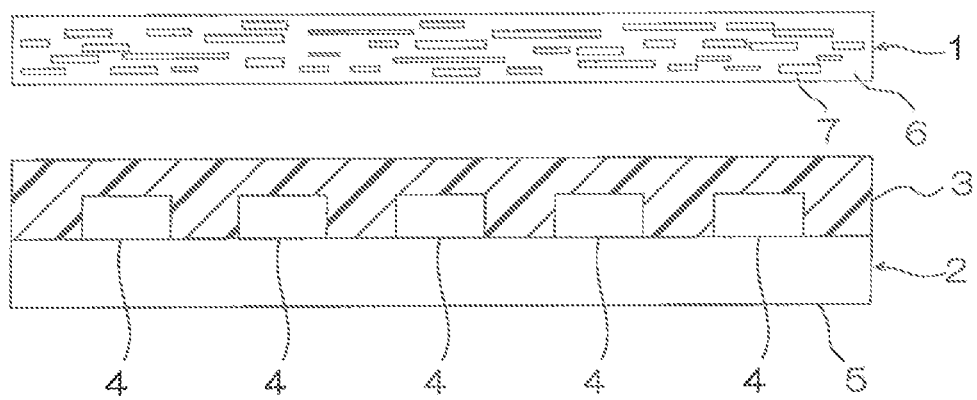
Figure 1C:
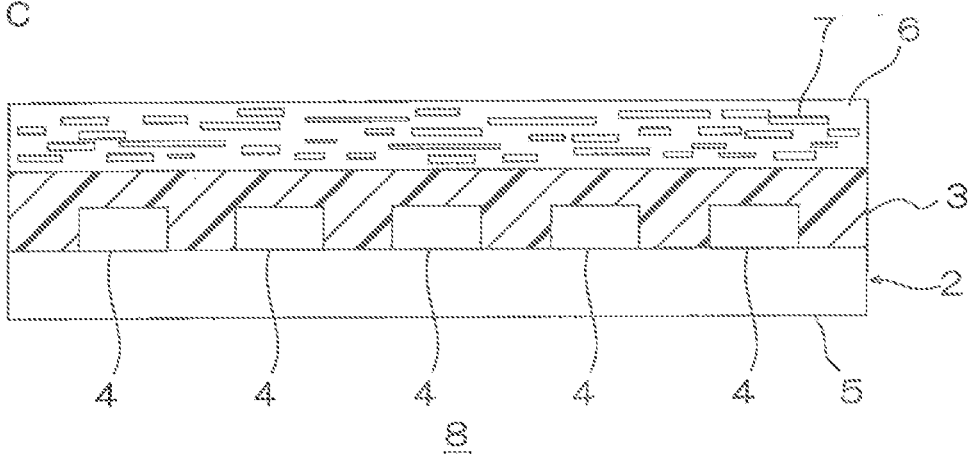

For example, as shown in FIGS. 1A to 1C, the soft magnetic film laminated circuit board of the present invention is produced by a step of preparing a soft magnetic film 1 and a circuit board 2, a step of laminating an adhesive layer 3 on the circuit board 2, and a step of laminating the soft magnetic film 1 onto the adhesive layer 3.

In this method, first, as shown in FIG. 1A, the soft magnetic film 1 and the circuit board 2 are prepared. To be more specific, the soft magnetic film 1 and the circuit board 2 in which a wiring pattern 4 is formed on the surface of a substrate 5 are prepared.

The soft magnetic film 1 is the one as described above, and includes a resin component 6 and soft magnetic particles 7 contained in the resin component 6. The soft magnetic particles 7 are preferably arranged in the 2-dementional in-plane direction of the soft magnetic film 1.

The circuit board 2 is, for example, a circuit board in which an electromagnetic induction system is used, and has the wiring pattern 4 of, for example, a loop coil formed on one side of the substrate 5. The wiring pattern 4 is composed of a metal material such as copper, and is formed by, for example, a semi-additive method or a subtractive method.

Examples of an insulating material that forms the substrate 5 include a glass epoxy substrate, a glass substrate, a PET substrate, a Teflon substrate, a ceramics substrate, and a polyimide substrate.

Then, as shown in FIG. 1B, the adhesive layer 3 is laminated on the circuit board 2. To be more specific, for example, an adhesive is applied on the surface of the circuit board 2 so as to cover the top face and the side faces of the wiring pattern 4.

For the adhesive that forms the adhesive layer 3, a known and generally used one as the adhesive layer 3 of the circuit board 2 is used, and for example, adhesives such as an epoxy adhesive, a polyimide adhesive, and an acrylic adhesive are used. The adhesive layer 3 has a thickness of, for example, 10 to 100 μm.

Then, as shown in FIG. 1C, the soft magnetic film 1 is laminated on the adhesive layer 3. To be specific, the soft magnetic film 1 is brought into contact with the surface of the adhesive layer 3.

In this manner, a soft magnetic film laminated circuit board 8 in which the soft magnetic film 1 is laminated on the circuit board 2 is produced.

The soft magnetic film laminated circuit board 8 can be used for various intended uses, and for example, can be used for position detection devices, smartphones, and personal computers.

Although the soft magnetic film 1 is laminated on the circuit board 2 with the adhesive layer 3 therebetween in the soft magnetic film laminated circuit board 8 of the embodiment of FIGS. 1A to 1C, for example, though not shown, the soft magnetic film 1 can be directly laminated on the circuit board 2 without the adhesive layer 3 interposed therebetween.

In this case, by curing the soft magnetic film 1 after laminating the soft magnetic film in semi-cured state 1 on the circuit board 2 so that the surfaces (top face and side faces) of the wiring pattern 4 are covered with (embedded in) the soft magnetic film 1, the soft magnetic film laminated circuit board 8 can be produced.

5. Position Detection Device

A position detection device of the present invention includes, for example, a sensor substrate including the above-described soft magnetic film laminated circuit board and a sensor unit mounted on the soft magnetic film laminated circuit board, and a position detection flat plate disposed to face on the sensor substrate.

Examples of the method for a reflowing step at the time of mounting the sensor unit on the soft magnetic film laminated circuit board include hot-air reflowing and infrared reflowing. Either entire heating or partial heating can be performed.

The heating temperature in the reflowing step is, for example, 200° C. or more, preferably 240° C. or more, and for example, 300° C. or less, preferably 265° C. or less. The heating time is, for example, 1 second or more, preferably 5 seconds or more, more preferably 30 seconds or more, and for example, 2 minutes or less, preferably 1.5 minutes or less.

By disposing the position detection flat plate on the sensor substrate produced as described above in spaced-apart relation so as to face thereto, the position detection device is produced.

The soft magnetic particle powder is soft magnetic particle powder consisted of flat soft magnetic particles, and the soft magnetic particle powder has a particle size $D_{10}$ and a particle size $D_{50}$ measured with a laser diffraction particle size distribution analyzer satisfying formula below: $D_{10}/D_{50} > 0.30$. Thus, the specific surface area of the soft magnetic particles can be further more surely reduced, so that when a soft magnetic film is formed from a soft magnetic resin composition containing the soft magnetic particle powder and the resin component, the soft magnetic particles can be contained with a high content rate. The soft magnetic film can be made thinner as well. Therefore, a thin soft magnetic film can be achieved with excellent relative magnetic permeability.

With the soft magnetic particle powder, a soft magnetic film with excellent relative magnetic permeability can be produced without necessitating surface treatment to the soft magnetic particles.

Furthermore, the soft magnetic film laminated circuit board and the position detection device including the soft magnetic film can be made small and achieve efficiency, because the soft magnetic film can be thin and have excellent relative magnetic permeability.

EXAMPLES

In the following, the present invention will be described in detail with Examples and Comparative Examples, but the present invention is not limited thereto. Values in Examples shown below can be replaced with the values described in the embodiments above (that is, upper limit value or lower limit value).

Example 1

(Classification of Soft Magnetic Particle Powder)

Sendust (Fe—Si—Al alloy, trade name "SP-7", flat, manufactured by MATE CO., LTD, coercive force 67 A/m) was used for flat soft magnetic particle powder. Using a dry classifier (manufactured by NISSHIN ENGINEERING INC., turbo classifier TC-15NS), air was blown onto the soft magnetic particle powder under conditions of a rotational speed of a rotational vane of 2140 rpm and an air flow rate of 1.3 $m^3$/min Lightweight particles were blown off, and heavyweight particles were collected, thereby producing soft magnetic particle powder of Example 1.

The particle sizes $D_{10}$ and $D_{50}$ of the soft magnetic particle powder of Example 1 were measured using a laser diffraction particle size distribution analyzer (manufactured by Sympatec, HELOS & RODOS). Table 1 shows the results.

(Soft Magnetic Film)

Then, 900 parts by mass (90 mass %) of the soft magnetic particle powder of Example 1, 50 parts by mass of acrylate ester polymer, 20 parts by mass of bisphenol A epoxy resin (1), 12 parts by mass of bisphenol A epoxy resin (2), 18 parts by mass of phenol aralkyl resin, and 0.5 parts by mass of thermosetting catalyst were mixed so that the soft magnetic particle content (sold content) in the soft magnetic resin composition was 60% by volume, thereby producing a soft magnetic resin composition.

The soft magnetic resin composition was dissolved in methyl ethyl ketone, thereby preparing a solution of the soft magnetic resin composition having a solid content concentration of 12 mass %.

The solution of the soft magnetic resin composition was applied using an applicator on a separator (average thickness 50 μm) composed of a polyethylene terephthalate film to which silicone release treatment was given, and thereafter, dried at 130° C. for 2 minutes.

In this manner, a soft magnetic film in semi-cured state on which a separator was laminated (average thickness of only soft magnetic film 35 μm) was produced.

Two soft magnetic films (semi-cured state) were produced, and these soft magnetic films (excluding separators) were laminated. The two laminated soft magnetic films were laminated and heat-pressed at 100 MPa and 175° C. for 30 minutes, thereby producing a soft magnetic film (cured state) having a thickness of 60 μm.

Example 2

Classification was performed in the same manner as in Example 1, except that conditions of the dry classifier were changed to a rotational speed of a rotational vane of 1700 rpm and an air flow rate of 1.5 m³/min, thereby producing soft magnetic particle powder of Example 2. A soft magnetic film was produced in the same manner as in Example 1, except that the soft magnetic particle powder of Example 2 was used. Table 1 shows the results.

Example 3

Classification was performed in the same manner as in Example 1, except that conditions of the dry classifier were changed to a rotational speed of a rotational vane of 1190 rpm and an air flow rate of 1.2 m³/min, thereby producing soft magnetic particle powder of Example 3. A soft magnetic film was produced in the same manner as in Example 1, except that the soft magnetic particle powder of Example 3 was used. Table 1 shows the results.

Example 4

Classification was performed in the same manner as in Example 1, except that conditions of the dry classifier were changed to a rotational speed of a rotational vane of 850 rpm and an air flow rate of 1.4 m³/min, thereby producing soft magnetic particle powder of Example 4. A soft magnetic film was produced in the same manner as in Example 1, except that the soft magnetic particle powder of Example 4 was used. Table 1 shows the results.

Example 5

Classification was performed in the same manner as in Example 1, except that conditions of the dry classifier were changed to a rotational speed of a rotational vane of 2500 rpm and an air flow rate of 1.4 m³/min, thereby producing soft magnetic particle powder of Example 5. A soft magnetic film was produced in the same manner as in Example 1, except that the soft magnetic particle powder of Example 5 was used. Table 1 shows the results.

Example 6

Classification was performed in the same manner as in Example 1, except that Sendust (Fe—Si—Al alloy, trade name "FME3DH", flat, true specific gravity 6.8 g/cm³, manufactured by SANYO SPECIAL STEEL Co., Ltd.) was used for the flat soft magnetic particles and conditions of the dry classifier were changed to a rotational speed of a rotational vane of 2900 rpm and an air flow rate of 1.4 m³/min, thereby producing soft magnetic particle powder of Example 6. A soft magnetic film was produced in the same manner as in Example 1, except that the soft magnetic particle powder of Example 6 was used. Table 1 shows the results.

Example 7

Classification was performed in the same manner as in Example 6, except that conditions of the dry classifier were changed to a rotational speed of a rotational vane of 2750 rpm and an air flow rate of 1.3 m³/min, thereby producing soft magnetic particle powder of Example 7. A soft magnetic film was produced in the same manner as in Example 1, except that the soft magnetic particle powder of Example 7 was used. Table 1 shows the results.

Comparative Example 1

Classification was performed in the same manner as in Example 1, except that conditions of the dry classifier were changed to a rotational speed of a rotational vane of 1850 rpm and an air flow rate of 1.5 m³/min, and lightweight particles were collected, thereby producing soft magnetic particle powder of Comparative Example 1. A soft magnetic film was produced in the same manner as in Example 1, except that the soft magnetic particle powder of Comparative Example 1 was used. Table 1 shows the results.

Comparative Example 2

Classification was performed in the same manner as in Example 1, except that conditions of the dry classifier were changed to a rotational speed of a rotational vane of 2800 rpm and an air flow rate of 1.1 m³/min, thereby producing soft magnetic particle powder of Comparative Example 2. A soft magnetic film was produced in the same manner as in Example 1, except that the soft magnetic particle powder of Comparative Example 2 was used. Table 1 shows the results.

(Film-Forming Characteristics)

In Examples and Comparative Examples, at the time of producing the soft magnetic films by applying the soft magnetic resin compositions, a case where the soft magnetic resin composition could be formed into a film and a film surface was uniform was evaluated as "Excellent"; a case where the soft magnetic resin composition could be formed into a film but the film surface was non-uniform was evaluated as "Good"; and a case where the soft magnetic resin composition failed to be formed into a film was evaluated as "Bad". Table 1 shows the results.

(Relative Magnetic Permeability)

The relative magnetic permeability of the soft magnetic films produced in Examples and Comparative Examples was measured by measuring an impedance at 1 MHz using an impedance analyzer (manufactured by Agilent, product number "4294A"). Table 1 shows the results.

TABLE 1

| | | Ex. 1 | Ex. 2 | Ex. 3 | Ex. 4 | Ex. 5 | Ex. 6 | Ex. 7 | Comp. Ex. 1 | Comp. Ex. 2 |
|---|---|---|---|---|---|---|---|---|---|---|
| Soft | D10 (μm) | 35 | 39 | 40 | 55 | 33 | 13 | 17 | 2 | 15 |
| Magnetic | D50 (μm) | 76 | 78 | 80 | 104 | 82 | 40 | 50 | 17 | 55 |
| Particle | D90 (μm) | 130 | 130 | 132 | 155 | 134 | 85 | 89 | 31 | 93 |
| Powder | D10/D50 | 0.46 | 0.50 | 0.50 | 0.53 | 0.40 | 0.32 | 0.34 | 0.12 | 0.27 |
| Film-Forming Characteristics | | Excellent | Excellent | Excellent | Good | Excellent | Excellent | Excellent | Excellent | Excellent |
| Relative Magnetic Permeability | | 250 | 259 | 272 | 282 | 218 | 204 | 227 | 177 | 184 |

For the components in Examples and Comparative Examples, the following were used.

Acrylate ester polymer: trade name "Paracron W-197CM", acrylate ester polymer mainly composed of ethyl acrylate-methyl methacrylate, manufactured by Negami Chemical Industrial Co., Ltd.

Bisphenol A epoxy resin (1): trade name "Epikote 1004", epoxy equivalent 875 to 975 g/eq, manufactured by JER Bisphenol A epoxy resin (2): trade name "Epikote YL980", epoxy equivalent 180 to 190 g/eq, manufactured by JER Phenolaralkyl resin: trade name "MILEX XLC-4L", hydroxyl equivalent 170 g/eq, manufactured by Mitsui Chemicals, Inc.

Thermosetting catalyst: trade name "CUREZOL 2-PHZ-PW", 2-phenyl-1H-imidazole 4,5-dimethanol, manufactured by Shikoku Chemicals Corporation While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The soft magnetic particle powder, the soft magnetic resin composition, the soft magnetic film, the soft magnetic film laminated circuit board, and the position detection device of the present invention can be applied in various industrial products. The soft magnetic particle powder, the soft magnetic resin composition, the soft magnetic film, and the soft magnetic film laminated circuit board of the present invention can be, for example, used for a position detection device or the like, and the position detection device of the present invention can be, for example, used for portable terminals such as smartphones and tablet computers, and digitizers.

DESCRIPTION OF REFERENCE NUMERALS

1 Soft magnetic film
2 Circuit board
6 Resin component
7 Soft magnetic particles
8 Soft magnetic film laminated circuit board

The invention claimed is:

1. Soft magnetic particle powder composed of flat soft magnetic particles,
   wherein the soft magnetic particle powder has a particle size $D_{10}$ and a particle size $D_{50}$ measured with a laser diffraction particle size distribution analyzer satisfying formula below:

$$D_{10}/D_{50} > 0.45,$$

wherein the particle size $D_{50}$ is 40 µm or more, and
   wherein the soft magnetic particle powder has a particle size $D_{90}$ measured with the laser diffraction particle size distribution analyzer that is 100 µm or more and 150 µm or less.

2. A soft magnetic resin composition containing the soft magnetic particle powder according to claim 1 and a resin component.

3. The soft magnetic resin composition according to claim 2, wherein
   the resin component contains epoxy resin, phenol resin, and acrylic resin.

4. A soft magnetic film formed from a soft magnetic resin composition containing the soft magnetic particle powder according to claim 1 and a resin component.

5. A soft magnetic film laminated circuit board produced by laminating a soft magnetic film on a circuit board, wherein
   the soft magnetic film is formed from a soft magnetic resin composition containing the soft magnetic particle powder according to claim 1 and a resin component.

6. A position detection device comprising:
   a soft magnetic film laminated circuit board produced by laminating a soft magnetic film on a circuit board, wherein
   the soft magnetic film is formed from a soft magnetic resin composition containing the soft magnetic particle powder according to claim 1 and a resin component.

* * * * *